United States Patent [19]
McKenzie

[11] Patent Number: 4,495,425
[45] Date of Patent: Jan. 22, 1985

[54] $V_{BE}$ VOLTAGE REFERENCE CIRCUIT

[75] Inventor: James A. McKenzie, Austin, Tex.

[73] Assignee: Motorola, Inc., Schaumburg, Ill.

[21] Appl. No.: 391,780

[22] Filed: Jun. 24, 1982

[51] Int. Cl.³ .......... G05F 3/16; H03L 1/00
[52] U.S. Cl. .......... 307/297; 307/296 R; 323/315
[58] Field of Search .......... 307/296, 297, 571; 330/257, 253; 323/315, 316

[56] References Cited

U.S. PATENT DOCUMENTS

| | | | |
|---|---|---|---|
| 3,649,926 | 3/1972 | Hill | 330/257 |
| 3,852,679 | 12/1974 | Schade, Jr. | 330/253 |
| 4,123,698 | 10/1978 | Timko et al. | 323/316 |
| 4,399,374 | 8/1983 | Boeke | 323/316 |

*Primary Examiner*—Stanley D. Miller
*Assistant Examiner*—B. P. Davis
*Attorney, Agent, or Firm*—Anthony J. Sarli, Jr.; Jeffrey Van Myers; Robert L. King

[57] ABSTRACT

A voltage reference circuit is disclosed having a common gate differential stage which utilizes the base-to-emitter voltage $V_{BE}$, of a bipolar transistor to provide a reference current through a first resistor. Current mirror means are coupled to the differential stage to couple the reference current to second and third resistors which develop the output reference voltage. By ratioing the second and third resistors to the first resistor, a stable output reference voltage which is proportional to the $V_{BE}$ of the bipolar transistor is provided.

14 Claims, 1 Drawing Figure

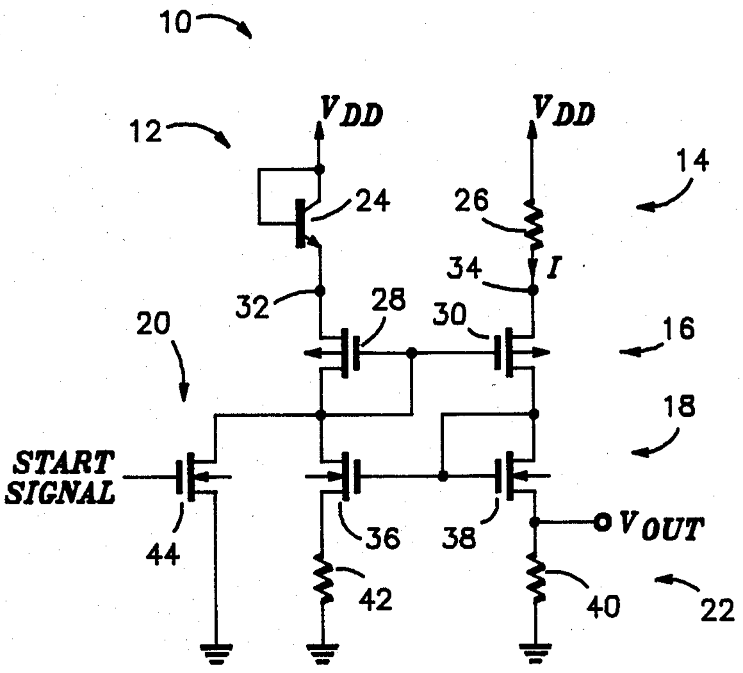
10
12
14
16
18
20
22
24
26
28
30
32
34
36
38
40
42
44
$V_{DD}$
$V_{DD}$
I
START SIGNAL
$V_{OUT}$

$V_{BE}$ VOLTAGE REFERENCE CIRCUIT

CROSS REFERENCE TO RELATED APPLICATION

Related subject matter can be found in the following copending application which is assigned to the assignee hereof:

U.S. Pat. No. 4,450,367, entitled "Delta $V_{BE}$ BIAS CURRENT REFERENCE CIRCUIT", filed Dec. 11, 1981, by Roger A. Whatley.

TECHNICAL FIELD

This invention relates generally to reference circuits, and, more particularly, to a circuit which provides reference voltages proportional to a base-to-emitter voltage, $V_{BE}$.

BACKGROUND ART

A common voltage reference standard is the $V_{BE}$ of a transistor. Although known reliable $V_{BE}$ references exist, such voltage references are commonly implemented with at least one regulating operational amplifier which may not be efficient for all size and power considerations.

BRIEF SUMMARY OF THE INVENTION

It is an object of the present invention to provide an improved voltage reference circuit.

Another object of the present invention is to provide an MOS voltage reference circuit which is smaller and simpler than related circuits in the prior art.

Yet another object of the present invention is to provide an improved voltage reference circuit which may be easily implemented in integrated circuit form using a minimum of circuit area.

In carrying out the above and other objects and advantages of the present invention, there is provided, in one form, a voltage reference circuit having a bipolar transistor. A differential stage is coupled to the bipolar transistor and a first resistor to reflect the $V_{BE}$ voltage of the bipolar transistor across the first resistor. A current mirror is coupled to the differential stage to mirror the reference current to second and third resistors coupled to the current mirror. An output reference voltage which is proportional to the $V_{BE}$ voltage is developed across the second and third resistors. Tne above and other objects, features and advantages of the present invention will be more clearly understood from the following detailed description taken in conjunction with the accompanying drawing.

BRIEF DESCRIPTION OF THE DRAWING

The single FIGURE illustrates in schematic form a voltage reference circuit constructed in accordance with a preferred embodiment of the present invention.

DESCRIPTION OF THE PREFERRED EMBODIMENT

Shown in the single drawing is a voltage reference circuit 10 comprised generally of reference voltage portion 12, reference current portion 14, differential stage portion 16, current mirror portion 18, a start-up portion 20 and an output portion 22. While specific N-channel and P-channel MOS devices are shown, it should be clear that voltage reference 10 could be implemented by completely reversing the processing techniques (E.G. P-channel to N-channel or by using other types of transistors.

Referring to the FIGURE, reference voltage portion 12 comprises a bipolar transistor 24 having the base and collector electrodes thereof connected together and coupled to a power supply voltage $V_{DD}$. Reference current portion 14 comprises a resistor 26 having a first terminal coupled to power supply voltage $V_{DD}$ and a second terminal. Differential stage portion 16 comprises P-channel MOS transistors 28 and 30. MOS transistor 28 has a source electrode connected to an emitter electrode of bipolar transistor 24 at node 32. A gate electrode and a drain electrode of transistor 28 are connected together to a gate electrode of transistor 30. MOS transistor 30 has a source electrode connected to the second terminal of resistor 26 at node 34. Current mirror portion 18 comprises N-channel MOS transistors 36 and 38. N-channel transistor 36 has a drain electrode connected to the source and gate electrodes of transistor 28 and to the gate electrode of transistor 30. N-channel transistor 38 has a drain electrode connected to its gate electrode. The drain and gate electrodes of transistor 38 are both connected to the drain electrode of transistor 30 and to the gate electrode of transistor 36. Output portion 22 comprises resistors 40 and 42. Resistor 40 has a first terminal coupled to the source electrode of transistor 38 and a second terminal coupled to a voltage node such as ground. Resistor 42 has a first terminal coupled to the source electrode of transistor 36 and a second terminal coupled to the ground voltage node. Start-up portion 20 comprises an N-channel MOS transistor 44 having a drain electrode connected to the source and gate electrodes of transistor 28 and to the drain electrode of transistor 36. Transistor 44 has a gate electrode coupled to a start signal and a source electrode coupled to the ground voltage node. The start signal (not shown) may be a momentary positive voltage signal sufficient to make transistor 44 conduct thereby supplying a current path through transistors 28 and 44 to ground and inducing current flow through transistors 30 and 38.

In operation, transistors 28, 30, 36 and 38 function as a common gate differential amplifier with first and second inputs at nodes 32 and 34, respectively. Bipolar transistor 24 establishes a reference voltage at node 32 which is approximately $V_{DD}-(V_{BE}$ of transistor 24). The differential stage portion 16 functions to maintain the same voltage at node 34 which exists at node 32. The voltage across resistor 26 is therefore $V_{BE}$. Resistor 26 establishes a reference current I which flows through transistors 30 and 38 and resistor 40. Therefore, bipolar transistor 24 functions as a reference voltage means and resistor 26 functions as a reference current means. When the gate dimensions of transistors 28 and 36 are sized substantially the same as the gate dimensions of transistors 30 and 38, respectively, substantially the same current I flows through transistors 28 and 36 and resistor 42. In this configuration, transistors 28 and 36 function as a bias current means for providing a constant bias current for bipolar transistor 24. Transistors 30 and 38 function as a bias voltage means for providing a bias voltage to the bias current means. The output reference voltage $V_{OUT}$ exists at the first terminal of resistor 40 and is substantially $(R_{40}/R_{26})V_{BE}$ volts where $R_{40}$ is the value of resistor 40 in ohms and $R_{26}$ is the value of resistor 26 in ohms. The same reference voltage is provided at the first terminal of resistor 42 (not shown) which is substantially $(R_{42}/R_{26})V_{BE}$ volts where $R_{42}$ is the value of resistor 42 in ohms. The value of resistance of resistors 40 and 42 must be substantially the same because transistors 36 and 38 require the same gate-to-source voltage, $V_{GS}$, in order to operate. However, any output reference voltage of any desired proportionality to $V_{BE}$ may be provided.

The function of transistor 44 is to start voltage reference circuit 10 by pulling the gate electrodes of transistors 28 and 30 toward ground voltage potential. Reference circuit 10 has two stable states of operation. The first state of operation is when no current is flowing through P-channel transistors 28 and 30 and the output reference voltage is at ground voltage potential. In this state, the gate electrodes of transistors 28 and 30 are biased at a positive voltage potential sufficient to make transistors 28 and 30 nonconducting. Such a voltage potential would be greater than the arithmetic sum of $V_{DD}$ and the threshold voltage of P-channel transistor 28. The first state of operation may occur when the start signal is at any sufficiently low voltage potential to make transistor 44 nonconducting. The second state of operation is when current begins to flow through transistors 28 and 30. Reference circuit 10 will provide a stable output reference voltage once transistor 44 is made to conduct thereby inducing current flow through diode-connected transistor 28. Current flow through transistor 28 induces current to flow through transistors 30 and 38. Once an output reference voltage exists, reference circuit 10 is self-regulating and the start signal should be removed from the gate of transistor 44.

Although the output reference voltage of reference circuit 10 will contain a temperature coefficient, the initial tolerance to processing variation is low. The nominal value of the output voltage at 25° C. over processing will not vary greatly. This is because in conventional MOS processes the forward bias voltage of the base-emitter junction of transistor 24 is practically immune to ambient variations and process changes. The only susceptibility to variation of the $V_{BE}$ of transistor 24 is a change in current flowing through transistor 24. However, the current fluctuations through transistor 24 due to process and temperature variations will not be of sufficient magnitude to cause significant forward bias voltage variations across the base-emitter junction.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A voltage reference circuit comprising:
reference voltage means, for providing an output reference voltage;
reference current means, for providing a reference current proportional to the output reference voltage;
a differential stage having first and second inputs coupled to said reference voltage means and reference current means, respectively, and first and second current outputs;
first and second impedances, each having a first terminal coupled to a voltage node and a second terminal coupled to said first and second current outputs, respectively, for developing an output voltage proportional to said reference voltage; and
current mirror means coupled between said differential stage and said first and second impedances, for providing a mirror current to said first and second impedances.

2. A $V_{BE}$ voltage reference circuit comprising:
reference voltage means comprising a bipolar transistor, for providing an output reference voltage;
reference current means comprising a first resistor, for providing a reference current proportional to the ratio of the base to emitter voltage, $V_{BE}$, of the bipolar transistor and the resistance of said first resistor;
a differential stage having first and second inputs coupled to said reference voltage means and reference current means, respectively, and first and second current outputs;
second and third resistors each having a first terminal coupled to a voltage node and a second terminal coupled to said first and second current outputs, respectively, for developing an output voltage proportional to said reference voltage; and
current mirror means coupled between said differential stage and said second and third resistors, for providing a mirror current to said second and third resistors.

3. The $V_{BE}$ voltage reference circuit of claim 2 wherein the differential stage comprises first and second MOS transistors of a first conductivity type and said current mirror means comprise third and fourth MOS transistors of a second conductivity type.

4. The $V_{BE}$ voltage reference circuit of claim 3 wherein said first MOS transistor has a first current electrode coupled to said bipolar transistor and a gate electrode connected to its second current electrode, and said second MOS transistor has a first current electrode coupled to said first resistor, a gate electrode coupled to both the gate and second current electrodes of the first MOS transistor, and a second current electrode.

5. A $V_{BE}$ voltage reference circuit comprising:
reference voltage means comprising a bipolar transistor, for providing an output reference voltage;
reference current means comprising a first resistor, for providing a reference current proportional to the ratio of the base to emitter voltage, $V_{BE}$, of the bipolar transistor and the resistance of said first resistor;
a differential stage comprising first and second MOS transistor of a first conductivity type, said first MOS transistor having a first current electrode coupled to the bipolar transistor to form a first input, and a gate connected to its second current electrode to form a first current output, said second MOS transistor having a first current electrode coupled to the reference current means and forming a second input, a gate electrode coupled to both the gate and second current electrodes of the first MOS transistor, and a second current electrode forming a second current output;
second and third resistors each having a first terminal coupled to a voltage node and a second terminal coupled to said first and second current outputs, respectively, for developing an output voltage proportional to said reference voltage; and
current mirror means comprising third and fourth MOS transistors of a second conductivity type, said third MOS transistor having both a first current electrode and a gate electrode connected together and coupled to the second current electrode of said second MOS transistor, and a second current electrode coupled to the second terminal of said second resistor, and said fourth MOS transistor has a first current electrode coupled to both the gate and second current electrodes of said first MOS transistor, a gate electrode coupled to both the gate and the first current electrode of said third MOS transistor, and a second current electrode coupled to the second terminal of said third resistor.

6. The $V_{BE}$ voltage reference circuit of claim 5 wherein said second and third resistors have substantially equal resistance which is ratioed to the resistance of said first resistor.

7. The $V_{BE}$ voltage reference circuit of claim 5 wherein said bipolar transistor is diode-connected.

8. The $V_{BE}$ voltage reference circuit of claim 5 further comprising means for applying a start potential to the gate electrode of the first MOS transistor.

9. A voltage reference circuit comprising:

reference voltage means comprising a bipolar transistor, for providing an output reference voltage;

reference current means comprising a first resistor, for providing a reference current proportional to the ratio of the base to emitter voltage, $V_{BE}$, of the bipolar transistor and the resistance of said first resistor;

bias voltage means coupled to the reference current means, for providing a bias voltage proportional to said reference current;

bias current means coupled to both the bias voltage means and the reference voltage means, for providing the bias current for said reference voltage means, said bias current being proportional to said bias voltage;

a second resistor coupled to said bias voltage means, for providing an output reference voltage which is proportional to the $V_{BE}$ of said bipolar transistor; and a third resistor coupled to said bias current means, having a resistance proportional to the resistance of said first and second resistors, for also providing said output reference voltage.

10. The $V_{BE}$ voltage reference circuit of claim 9 wherein the bipolar transistor is diode-connected and coupled in series with a diode-connected first MOS transistor, said first MOS transistor developing said reference voltage on the gate electrode thereof.

11. A voltage reference circuit comprising:

reference voltage means comprising a diode-connected bipolar transistor, for providing an output reference voltage;

reference current means comprising a first resistor, for providing a reference current proportional to the ratio of the base to emitter voltage, $V_{BE}$, of the bipolar transistor and the resistance of said first resistor;

bias voltage means comprising a second MOS transistor coupled in series to the reference current means and having said reference voltage coupled to the gate electrode thereof, for providing a bias voltage proportional to said reference current;

bias current means coupled to both the bias voltage means and the reference voltage means comprising a diode-connected first MOS transistor coupled in series with the bipolar transistor and developing the reference voltage on the gate electrode thereof, for providing the bias current for said reference voltage means, said bias current being proportional to said bias voltage;

a second resistor coupled to said bias voltage means, for providing an output reference voltage which is proportional to the $V_{BE}$ of said bipolar transistor; and a third resistor coupled to said bias current means, having a resistance proportional to the resistance of said first and second resistors, for also providing said output reference voltage.

12. The voltage reference circuit of claim 11 wherein the bias voltage means further comprise a third diode-connected MOS transistor having said reference current coupled thereto, said third MOS transistor developing the bias voltage on the gate electrode thereof.

13. The voltage reference circuit of claim 12 wherein the bias current means further comprise a fourth MOS transistor having the bias voltage coupled to the gate electrode thereof, said fourth MOS transistor providing the bias current for the reference voltage means.

14. The voltage reference circuit of claim 10 further comprising means for applying a start potential to the gate electrode of said first MOS transistor.

* * * * *

UNITED STATES PATENT AND TRADEMARK OFFICE

CERTIFICATE OF CORRECTION

PATENT NO. : 4,495,425

DATED : January 22, 1985

INVENTOR(S) : James A. McKenzie

It is certified that error appears in the above-identified patent and that said Letters Patent is hereby corrected as shown below:

In claim 5, column 4, line 48, change "transistor" to --transistors--.

Signed and Sealed this

*Fourteenth* Day of *May 1985*

[SEAL]

*Attest:*

DONALD J. QUIGG

*Attesting Officer* *Acting Commissioner of Patents and Trademarks*